US 6,191,626 B1
Feb. 20, 2001

(54) METHOD AND APPARATUS FOR COMPENSATING INPUT THRESHOLD VARIATIONS ON INPUT BUFFERS

(75) Inventors: Daniel G. Prysby, Elk Grove Village; Brett Walter Chaveriat, Arlington Heights; Ronald Joseph Sullivan, Huntley; Ron Rotstein, Buffalo Grove, all of IL (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/365,010

(22) Filed: Aug. 2, 1999

Related U.S. Application Data

(60) Provisional application No. 60/096,910, filed on Aug. 17, 1998.

(51) Int. Cl.$^7$ .................................................. H03L 7/00
(52) U.S. Cl. ........................................... 327/143; 327/198
(58) Field of Search ..................................... 327/143, 198, 327/538, 540, 541, 543, 378, 72, 73, 344

(56) References Cited

U.S. PATENT DOCUMENTS

| | | | | |
|---|---|---|---|---|
| 4,447,774 | * | 5/1984 | Stalberg | 328/150 |
| 4,607,178 | * | 8/1986 | Sugie et al. | 327/143 |
| 5,479,132 | * | 12/1995 | Verhaeghe et al. | 327/553 |

* cited by examiner

*Primary Examiner*—Toan Tran
*Assistant Examiner*—Hiep Nguyen
(74) *Attorney, Agent, or Firm*—Mark E. Courtney; W. James Brady; Frederick J. Telecky, Jr.

(57) ABSTRACT

A method and apparatus for compensating for input threshold variations in input buffers is provided. The method and apparatus compensate for input threshold variations by applying a bias voltage on a known capacitance of an RC calibration circuit using, for example, a pulse width modulator. The bias voltage helps ensure that the time to charge the known capacitance from the bias voltage to the input threshold voltage of the input buffer is independent of the threshold voltage. The bias voltage is chosen using an iterative process in which the time to charge from the bias voltage to the threshold voltage is compared with a reference time. The bias voltage is adjusted based on the comparison.

20 Claims, 1 Drawing Sheet

METHOD AND APPARATUS FOR COMPENSATING INPUT THRESHOLD VARIATIONS ON INPUT BUFFERS

This application claims priority under 35 USC § 119 (e) (1) of Provisional Application No. 60/096,910, filed Aug. 17, 1989.

TECHNICAL FIELD OF THE INVENTION

This invention relates generally to input buffers. More specifically, this invention relates to a method and system for compensating for input threshold variations on input buffers.

BACKGROUND OF THE INVENTION

RC circuits are useful in a number of contexts. For example, RC circuits may be used for creating a fixed timeout from known resistance and capacitance values, and for measuring an unknown resistance or capacitance value from a known capacitance or resistance and a measured timeout. More specifically, an external RC circuit may be used in combination with a digital integrated circuit to generate a time dependent wave form to measure a threshold crossing for an input buffer.

When an RC circuit is used to generate such a timeout in combination with an input buffer, the timeout time is also a function of the threshold voltage. Nevertheless, threshold voltage may vary from input buffer to input buffer. These variations in threshold voltage can be minimized by using, for example, an analog fabrication technique as opposed to the typical digital CMOS fabrication process. Such fabrication techniques are, however, more complex and therefore more costly.

SUMMARY OF THE INVENTION

Therefore, a need has arisen for a method and apparatus to compensate for threshold voltage variations in input buffers. A method and apparatus according to the embodiments of the present invention compensate for variations in threshold voltage using a digital technique.

A system for compensating for variations in threshold voltage of a plurality of input buffers on a die is disclosed. The system includes a plurality of RC measurement circuits, each RC measurement circuit associated with one of the input buffers such that when a voltage across the capacitor of the RC measurement circuit exceeds the threshold voltage of the associated input buffer, the associated input buffer provides a logical one at its output. The system further includes a calibration circuit comprising a calibration capacitor having a known capacitance, a calibration resistor having a known resistance, a calibration input buffer connected to the calibration capacitor, the calibration input buffer operative to produce a logical one at its output when a voltage across the calibration capacitor exceeds a threshold voltage of the calibration input buffer, a voltage source operative to apply a voltage across the calibration capacitor, means for setting the voltage supplied by the voltage source and control circuitry for measuring an elapsed time between a time after which the voltage source applies an initial voltage across the calibration capacitor and a time at which the calibration input buffer provides a logical one at its output. The control circuitry is operative to compare the elapsed time with a reference time. The means for setting the voltage supplied by the voltage source is operative to adjust the initial voltage applied across the capacitor in response to the comparison. The system also includes means to apply the adjusted voltage to said plurality of RC measurement circuits.

The present invention also includes a method for compensating for variations in a threshold voltage of an input buffer that is operative to produce a logical one at its output when a voltage across a capacitor of an RC measurement circuit exceeds its threshold voltage. The method begins by setting the voltage across the capacitor to an initial voltage value. The method then measures an elapsed time between a time after which the voltage across the capacitor is set to the initial voltage value and a time at which the input buffer provides a logical one at its output. The elapsed time is then compared with a reference time, and the initial voltage value is adjusted based on the comparison.

The above-described embodiments of the present invention provide various technical advantages. For example, the embodiments of the present invention provide a simple and inexpensive method and apparatus for compensating for input threshold variations in an input buffer. In addition, the method and apparatus according to the embodiments of the present invention provide a digital compensation technique that is adjustable on the fly and thus capable of compensating for changes in input threshold that may occur due to varying operating conditions. Other technical advantages are apparent to one skilled in the art from the following figures, description and claims.

BRIEF DESCRIPTION OF THE DRAWINGS

The features and objects of the present invention, and the manner of attaining them are explained in detail in the following DETAILED DESCRIPTION OF THE INVENTION when taken in conjunction with the accompanying drawings wherein.

DETAILED DESCRIPTION OF THE INVENTION

RC circuits are useful in a number of environments as discussed above. In some environments RC circuits may be prevented from accurately performing their typical functions, e.g., creating a fixed timeout from known resistance and capacitance values, and for measuring an unknown resistance or capacitance value from a known capacitance or resistance and a measured timeout because of limitations in the devices they are being used with. For example, RC circuits are sometimes used in conjunction with input buffers to generate a timeout. Nevertheless, because the input threshold voltage of an input buffer might vary, the RC circuit cannot generate an accurate timeout. One solution proposed is the use of analog fabrication techniques to enable variations in threshold voltage to be minimized. These fabrication techniques are, however, more complex and expensive than typical digital CMOS fabrication techniques.

A method and apparatus for compensating for threshold voltage variations according to embodiments of the present invention enable RC circuits to accurately perform their typical functions without resort to expensive and complex fabrication techniques. Furthermore, the method and apparatus according to the embodiments of the present invention enable correction for threshold voltage variations for all input buffers on a particular die because threshold voltages for input buffers on the same die generally closely match and track.

The method and apparatus according to the embodiments of the present invention will be explained in conjunction with an input buffer circuit. It should, however, be understood that the method and apparatus for compensating for variations in input threshold voltage according to the embodiments of the present invention are useful in conjunction with other circuit arrangements.

Figure 1:
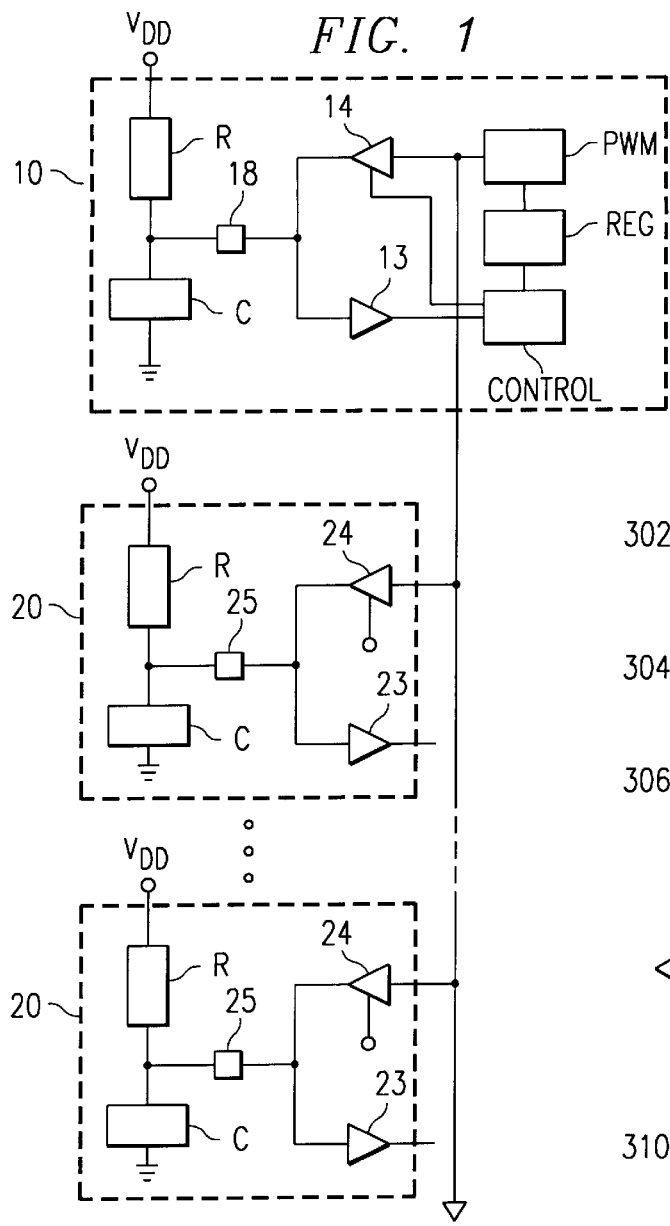
FIG. 1 schematically depicts a circuit including a calibration circuit for compensating for input threshold variations according to one embodiment of the present invention and a number of RC measurement circuits.

FIG. 1 schematically depicts a circuit arrangement according to one embodiment of the present invention including a calibration circuit 10 for compensating for input threshold variations and a number of RC measurement circuits 20. Calibration circuit 10 comprises calibration resistor 11, calibration capacitor 12, input buffer 13, tri-state output buffer 14, pulse width modulator 15, register 16, control circuitry 17 and calibration pin 18. RC measurement circuits 20 include resistor 21, capacitor 22, input buffer 23, tri-state output buffer 24 and I/O pin 25.

Resistor 21, capacitor 22, input buffer 23, tri-state output buffer 24 and I/O pin 25 of the RC measurement circuits are connected in a conventional configuration so resistor 21 and capacitor 22 generate a time dependent waveform for input buffer 23 to generate a timeout. This arrangement includes tri-state output buffer 24 positioned to reset the voltage across capacitor 22. Briefly, this arrangement produces a logical high at the output of input buffer 23 when the voltage across capacitor 22 exceeds the input threshold voltage of input buffer 23. Once this voltage is reached and buffer 23 produces a logical high ("a timeout"), the voltage across capacitor 22 is reset at I/O pin 25 using a signal from tri-state output buffer 24.

Figure 2:
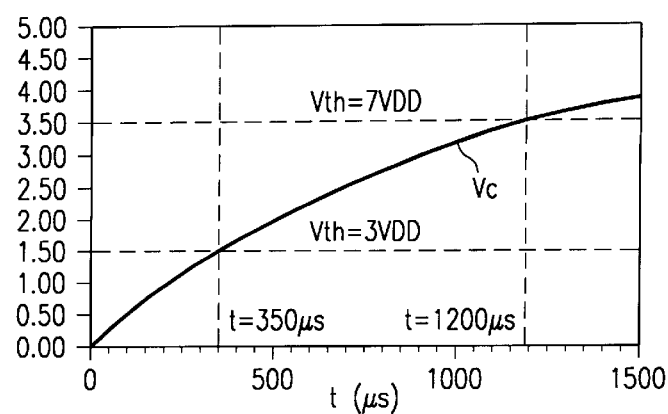
FIG. 2 is a graph of capacitor voltage versus time for an input buffer as shown in FIG. 1; and, FIG. 3 is a flow chart of a method for compensating for input threshold variations according to one embodiment of the present invention.

As will be appreciated by a skilled artisan if the threshold voltage of input buffer 23 varies, the time necessary to produce a timeout also varies. FIG. 2 is a graph of the voltage across capacitor 22 over time for an RC measurement circuit such as RC measurement circuit 20 where resistor 21 is a 10 kΩ resistor, capacitor 22 is a 0.10 µf capacitor and $V_{DD}$=5 volts. The horizontal dotted lines indicate the limits of the range of variation for threshold voltage, $V_{th}$ for input buffer 23. As can be seen from FIG. 2, the threshold voltage of input buffer 23, $V_{th}$, varies between 0.3 $V_{DD}$ and 0.7 $V_{DD}$. The vertical lines in FIG. 2 indicate the corresponding limits of the range of variation in timeout time, t for input buffer 23. As can be seen from FIG. 2, the variation in $V_{th}$ gives rise to a variation in t from about 350 µs to about 1200 µs.

Calibration resistor 11, calibration capacitor 12, input buffer 13 and tri-state output buffer 14 of calibration circuit 10 are also connected in a configuration to generate a time dependent waveform for input buffer 13 to generate a timeout. Calibration resistor 11 and calibration capacitor 12 have known resistance and capacitance values respectively. Input buffer 13 is a typical input buffer having an unknown threshold voltage. Output buffer 14 is preferably a tri-state output buffer and operates to apply a voltage across capacitor 12 upon receipt of an enable signal from control circuitry 17.

Calibration circuit 10, however, further includes, pulse width modulator 15, register 16 and control circuitry 17 to compensate for input buffer threshold variations. In one embodiment, pulse width modulator is an 8-bit pulse width modulator and thus has a duty cycle that is variable over 256 gradations. Pulse width modulator 15 operates to supply the voltage to be applied across capacitor 12. As is known in the art, a pulse width modulator supplies a square wave with a minimum value of zero potential and a maximum value of the supply voltage, in this embodiment, 5 volts. By filtering this square wave, however, the square wave can be made to have the effect of a dc voltage. In the circuit of FIG. 1, capacitor 12 provides its own such filtering effect to the square wave produced by pulse width modulator 15 and thus pulse width modulator 15 acts as a dc source. Further, by adjusting the duty cycle of the square wave supplied by pulse width modulator 15, that is, increasing or decreasing the length of time which the square wave spends at its maximum value as opposed to its minimum value, the level of the effective dc voltage supplied by pulse width modulator 15 is varied.

Register 16 supplies a signal to pulse width modulator 15 that adjusts the duty cycle of the square wave supplied by pulse width modulator 15. According to one embodiment, register 16 is an 8-bit up-down counter that supplies a count value between 1 and 256 to pulse width modulator 15. The count value is used by pulse width modulator 15 to set and adjust the duty cycle of the square wave it supplies.

Control circuitry 17 controls the functioning of calibration circuit 10. Control circuitry 17 senses the occurrence of a logical one from input buffer 13 and measures the timeout time t by measuring an elapsed time between a time after which the voltage across capacitor 12 is set (that is, the time after which control circuitry 17 supplies a reset enable signal to output buffer 14) and a time at which the logical one occurred. Control circuitry 17 then compares this timeout time with a reference time. The reference time is typically chosen based upon the component values of resistor 11 and capacitor 12 and the lower limit of the threshold of input buffer 13. Based on the results of this comparison, control circuitry 17 provides a control signal that causes register 16 to adjust the count value supplied to pulse width modulator 15 and thus causes pulse width modulator 15 to adjust the duty cycle of the square wave it supplies. In one embodiment, control circuitry 17 comprises digital logic.

According to one embodiment of the present invention, output buffer 14, pulse width modulator 15, register 16 and controller 17 are digital CMOS circuits and are advantageously fabricated on the same chip. Further, according to one of the technical advantages of the present invention, each of input buffers 23 from RC measurement circuits 20 and input buffer 13 from calibration circuit 10 are fabricated on the same chip so that the voltage developed by pulse width modulator 15 is used to compensate for input threshold variations for each input buffer on the same chip.

Figure 3:
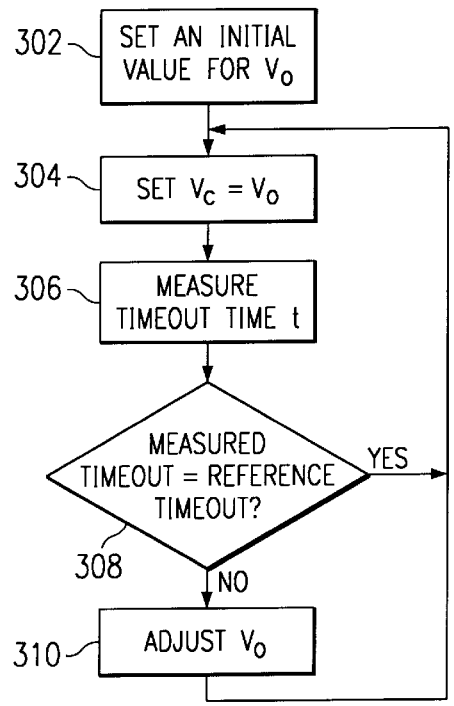

FIG. 3 shows a flow chart of a method for compensating for input threshold variations according to one embodiment of the present invention. The method of FIG. 3 will be explained with reference to the circuit of FIG. 1. Nevertheless, the method for compensating for input threshold variations according to the present invention is not limited to operation using the circuit elements depicted in FIG. 1.

In an initial step 302, the method for compensating for input threshold variations according to one embodiment sets an initial voltage value for $V_0$, where $V_0$ is used to indicate the initial voltage being used to bias calibration capacitor 12 of FIG. 1. In one preferred embodiment, the initial voltage value is zero. In step 304, the voltage across capacitor 12 is set to the initial voltage value, that is, $V_c=V_0$. According to one embodiment of the present invention, the net effect of steps 302 and 304 is that pulse width modulator 15 is initially set to have a 0% duty cycle.

Once the initial voltage is set and applied, calibration capacitor 12 is allowed to charge through calibration resistor 11 until a timeout is reached. In step 306 the timeout time t is measured. That is, control circuitry 17 measures the elapsed time between a time after which the voltage across calibration capacitor 12 is set to the initial voltage value $V_0$ and a time at which the timeout occurs, i.e., the time at which input buffer 13 provides a logical one at its output.

In step 308, the measured elapsed time is compared with a reference time. In the context of circuit 10 of FIG. 1, the comparison is done by control circuitry 17.

If the measured timeout time is equal to the reference time within certain tolerance limits, the method proceeds to step 304. In one particular embodiment, the tolerance limit is 5%. That is, if the measured timeout time is within 5% of the reference time, the method proceeds to step 304.

If, in step 308 the measured timeout time t is not equal to the reference time, then $V_0$ is adjusted. In the embodiment shown in FIG. 1, the adjustment is made by adjusting the duty cycle of the square wave supplied by pulse width modulator 15 using control circuitry 17 in conjunction with register 16. More specifically, if the measured timeout time is greater than the reference time, control circuitry 17 sends a signal to register 16 to increment its count by one. The adjusted count is in turn provided to pulse width modulator 15 to increase the duty cycle of the square wave. This will have the effect of shortening the timeout time because calibration capacitor 12 will begin the next cycle at a voltage closer to the threshold voltage of input buffer 13. If, on the other hand, the measured timeout is less than the reference time, control circuitry 17 sends a signal to register 16 to decrement its count by one. The adjusted count is in turn provided to pulse width modulator 15 to decrease the duty cycle of the square wave. The decreased duty cycle will increase the timeout time because calibration capacitor 12 will begin the next cycle at a voltage farther away from the threshold voltage of input buffer 13. The method then returns to step 304 and repeats.

It should be mentioned that the method and apparatus can be configured so that register 16 begins its count anywhere within its cycle. In one embodiment, register 16 begins at its minimum value (presumably zero) or its maximum value (256 for the embodiment where register 26 comprises an eight bit counter) and counts up or down respectively to increase the duty cycle of the square wave supplied by pulse width modulator 15 from 0%. In an alternative embodiment, register 16 begins somewhere in the middle of its count cycle and counts up or down to adjust the duty cycle of the square wave supplied by pulse width modulator 15 appropriately.

Advantageously, the signal generated from pulse width modulator 16 is used to compensate for variations in threshold voltage for all input buffers used for RC measurement circuits on the same die. That is, referring to FIG. 1, all input buffers 23 formed on the same die will have threshold voltages that closely match and track. Therefore, once the timeout time has stabilized to a value within tolerance limits of the reference time, the signal from pulse width modulator 16 is preferably provided at I/O pin 25 of RC measurement circuits 20 to compensate for threshold voltage variations in input buffers 23.

Although the present invention has been described in detail, it should be understood that various changes, substitutions, and alterations can be made without departing from the intended scope as defined by the appended claims.

What is claimed is:

1. A method for compensating for variations in a threshold voltage of an input buffer, said input buffer operative to produce a logical one at its output when a voltage across a capacitor of an RC measurement circuit exceeds the threshold voltage, said method comprising the following steps:

a. setting the voltage across the capacitor to an initial voltage value;

b. measuring an elapsed time between a time after which the voltage across the capacitor is set to the initial voltage value and a time at which the input buffer provides a logical one at its output;

c. comparing the elapsed time with a reference time; and, d. adjusting the initial voltage value based on the comparison.

2. The method of claim 1 wherein the step of setting the voltage across the capacitor to an initial voltage value comprises setting the voltage across the capacitor to a predetermined initial value.

3. The method of claim 1 wherein the step of adjusting the initial voltage value comprises incrementing the initial voltage value when the elapsed time is greater than the reference time.

4. The method of claim 1 wherein the step of adjusting the initial voltage value comprises decrementing the initial voltage value when the elapsed time is less than the reference time.

5. An apparatus for compensating for variations in threshold voltage of an input buffer, said input buffer operative to produce a logical one at its output when a voltage across a capacitor of an RC measurement circuit exceeds the threshold voltage, said apparatus comprising:

a voltage source operative to apply a voltage across the capacitor;

means for setting the voltage supplied by the voltage source;

control circuitry for measuring an elapsed time between a time after which the voltage source applies an initial voltage across the capacitor and a time at which the input buffer provides a logical one at its output;

said control circuitry operative to compare the elapsed time with a reference time; and, said means for setting the voltage supplied by the voltage source operative to adjust the initial voltage applied across the capacitor in response to said comparison.

6. The apparatus of claim 5 further comprising:

a plurality of input buffers having unknown threshold voltages;

a plurality of RC measurement circuits connected to said voltage source; and, said voltage source operative to apply a voltage across the capacitors of said plurality of RC measurement circuits.

7. The apparatus of claim 5 wherein the voltage source comprises a pulse width modulator.

8. The apparatus of claim 5 wherein the voltage source comprises a pulse width modulator supplying a square wave having an adjustable duty cycle and wherein the means for setting the voltage supplied by the voltage source comprises a register operative to adjust the duty cycle of the square wave supplied by the pulse width modulator.

9. The apparatus of claim 5 wherein the means for setting the voltage supplied by the voltage source sets the initial voltage to a chosen initial value.

10. The apparatus of claim 5 wherein the means for setting the voltage supplied by the voltage source increments the initial voltage when the elapsed time is greater than the reference time.

11. The apparatus of claim 8 wherein the register is incremented by one when the elapsed time is greater than the reference time and wherein incrementing the register by one increases the duty cycle of the square wave supplied by the pulse width modulator.

12. The apparatus of claim 5 wherein the means for setting the voltage supplied by the voltage source decrements the initial voltage when the elapsed time is less than the reference time.

13. The apparatus of claim 8 wherein the register is decremented by one when the elapsed time is less than the reference time and wherein decrementing the register by one decreases the duty cycle of the square wave supplied by the pulse width modulator.

14. A system for compensating for variations in threshold voltage of a plurality of input buffers on a die comprising:
 a plurality of RC measurement circuits, each RC measurement circuit associated with one of said input buffers such that when a voltage across the capacitor of the RC measurement circuit exceeds the threshold voltage of the associated input buffer, the associated input buffer provides a logical one at its output;
 a calibration circuit comprising:
  a calibration capacitor having a known capacitance;
  a calibration resistor having a known resistance;
  a calibration input buffer connected to said calibration capacitor, said calibration input buffer operative to produce a logical one at its output when a voltage across said calibration capacitor exceeds a threshold voltage of said calibration input buffer;
  a voltage source operative to apply a voltage across the calibration capacitor;
  means for setting the voltage supplied by the voltage source;
  control circuitry for measuring an elapsed time between a time after which the voltage source applies an initial voltage across the calibration capacitor and a time at which the calibration input buffer provides a logical one at its output;
  said control circuitry operative to compare the elapsed time with a reference time;
  said means for setting the voltage supplied by the voltage source operative to adjust the initial voltage applied across the capacitor in response to said comparison; and,
 means to apply the adjusted voltage to said plurality of RC measurement circuits.

15. The system of claim 14 wherein the voltage source comprises a pulse width modulator.

16. The system of claim 14 wherein the voltage source comprises a pulse width modulator supplying a square wave having an adjustable duty cycle and wherein the means for setting the voltage supplied by the voltage source comprises a register operative to adjust the duty cycle of the square wave supplied by the pulse width modulator.

17. The system of claim 14 wherein the means for setting the voltage supplied by the voltage source increments the initial voltage when the elapsed time is greater than the reference time.

18. The system of claim 16 wherein the register is incremented by one when the elapsed time is greater than the reference time and wherein incrementing the register by one increases the duty cycle of the square wave supplied by the pulse width modulator.

19. The system of claim 14 wherein the means for setting the voltage supplied by the voltage source decrements the initial voltage when the elapsed time is less than the reference time.

20. The system of claim 16 wherein the register is decremented by one when the elapsed time is less than the reference time and wherein decrementing the register by one decreases the duty cycle of the square wave supplied by the pulse width modulator.

* * * * *